United States Patent
Gross et al.

(10) Patent No.: US 6,723,926 B2
(45) Date of Patent: Apr. 20, 2004

(54) MOUNTING CONFIGURATION OF ELECTRIC AND/OR ELECTRONIC COMPONENTS ON A PRINTED CIRCUIT BOARD

(75) Inventors: Kurt Gross, Laaber (DE); Volker Karrer, Regensburg (DE); Michael Kirchberger, Neutraubling (DE); Stefan Kulig, Regensburg (DE); Gunter Ludwig, Schwarzenbruck (DE); Hans Rappl, Nittendorf (DE)

(73) Assignee: Siemens Aktiengesellschaft, Munich (DE)

( * ) Notice: Subject to any disclaimer, the term of this patent is extended or adjusted under 35 U.S.C. 154(b) by 9 days.

(21) Appl. No.: 10/134,929

(22) Filed: Apr. 29, 2002

(65) Prior Publication Data

US 2002/0159238 A1 Oct. 31, 2002

(30) Foreign Application Priority Data

Apr. 27, 2001 (DE) .......... 101 20 692

(51) Int. Cl.[7] ............... H05K 1/00
(52) U.S. Cl. .......... 174/252; 174/260; 174/262; 361/720; 257/706; 257/712; 257/717
(58) Field of Search .......... 174/252, 262–267, 174/260; 361/792–795, 720; 257/706, 712, 717

(56) References Cited

U.S. PATENT DOCUMENTS 2,502,291 A * 3/1950 Taylor .......... 29/830
3,013,188 A * 12/1961 Kohler .......... 361/774
3,228,091 A * 1/1966 Rice .......... 29/832
4,437,140 A * 3/1984 Ohyama et al. .......... 361/765
5,610,395 A * 3/1997 Nishiyama .......... 250/239
5,690,270 A * 11/1997 Gore .......... 228/180.22
5,769,907 A * 6/1998 Fukuda et al. .......... 29/25.03
5,920,458 A * 7/1999 Azar .......... 361/704
5,921,820 A * 7/1999 Dijkstra .......... 439/751
6,392,160 B1 * 5/2002 Andry et al. .......... 174/261

FOREIGN PATENT DOCUMENTS

| DE | 89 09 246.5 U1 | 11/1989 |
| DE | 277 165 A1 | 3/1990 |
| DE | 39 22 485 C1 | 6/1990 |
| DE | 39 30 158 A1 | 3/1991 |
| DE | 40 07 566 A1 | 9/1991 |
| DE | 41 07 312 A1 | 9/1992 |
| DE | 198 59 739 A1 | 7/2000 |

* cited by examiner

Primary Examiner—Kamand Cuneo
Assistant Examiner—Jose H. Alcala
(74) Attorney, Agent, or Firm—Laurence A. Greenberg; Werner H. Stemer; Ralph E. Locher

(57) ABSTRACT

A mounting configuration of electric and/or electronic components, in particular electrolytic capacitors, on a printed circuit board is described. The printed circuit board is formed by at least two metallic plates insulated electrically from one another by an insulating layer that preferably conducts heat well and has holes for the connecting pins of the electric and/or electronic components. Through which holes the connecting pins are plugged and connected electrically to the respectively associated metallic plate.

7 Claims, 1 Drawing Sheet

MOUNTING CONFIGURATION OF ELECTRIC AND/OR ELECTRONIC COMPONENTS ON A PRINTED CIRCUIT BOARD

BACKGROUND OF THE INVENTION

Field of the Invention

The invention relates to a mounting configuration of electric and/or electronic components on a printed circuit board.

Such a mounting configuration is disclosed in Published, Non-Prosecuted German Patent Application DE 41 07 312 A1. There, an electronic component is disposed on a printed circuit board which is composed of an electrically insulating substrate material which is laminated on both sides with a copper foil and, on its side facing away from the component, is connected via an electrically insulating adhesive layer to a metallic, plate-shaped cooling element. In order to improve the thermal conductivity, the substrate material is provided with holes, which are filled with an electrically conductive material and in this way permit better heat conduction between the two copper films.

In the case of the known mounting configuration, a relatively large number of holes per component are needed through the substrate material in order to achieve adequate heat conduction through the substrate material. This requires a relatively high outlay on production and is therefore costly. In addition, a relatively thick electrically insulating substrate is necessary, which is merely used for mechanical stabilization but provides no contribution to the thermal dissipation.

SUMMARY OF THE INVENTION

It is accordingly an object of the invention to provide a mounting configuration of electric and/or electronic components on a printed circuit board which overcomes the above-mentioned disadvantages of the prior art devices of this general type, which ensures good thermal dissipation and at the same time can be produced simply and therefore inexpensively.

With the foregoing and other objects in view there is provided, in accordance with the invention, a mounting configuration. The mounting configuration contains components each having connecting pins and a printed circuit board having an insulating layer and at least two metallic plates insulated electrically from one another by the insulating layer. The two metallic plates and the insulating layer have holes for receiving the connecting pins of the components mounted on the printed circuit board, and through the holes the connecting pins are plugged and connected electrically to one of the two metallic plates. Preferably the components are electrical and/or electronic components such as electrolytic capacitors.

The mounting configuration according to the invention has a printed circuit board that is formed by at least two metallic plates that are connected to one another by an electrically insulating, insulating layer that conducts heat well. In this case, the thickness of the metallic plates can be selected suitably in a simple way in order to ensure the necessary heat transport. One of the two metallic plates will normally be connected to a ground potential and the other to the supply voltage potential.

The special advantage of the configuration resides in the very low-resistance and low-inductive connection of the electric and/or electronic components. Both the thermal dissipation and the inductance are more beneficial the thinner the insulating layer. In addition, the capacitance of the two metallic plates assumes a value in the range of about 1 pF in the case of a very thin insulating layer, as a result of which a filtering effect with respect to electromagnetic interference occurs.

The two plates have substantially concentric holes, through which the connecting pins of electric and/or electronic components, in particular of electrolytic capacitors, are plugged. Holes located one above another advantageously have different diameters in such a way that the hole in the metallic plate which is not electrically connected to the respective connecting pin has a larger diameter. In this way, a contact between a connecting pin and the metallic plate to which it is not to be connected can be avoided better and, the risks that the material with which the contact pins are connected to the respective metallic plates, for example tin solder, will come into contact with the other plate is reduced substantially.

In a development of the invention, the connecting pins have different lengths, so that the connecting pins that are connected to the metallic plate facing the component and belonging to the printed circuit board do not project into the hole in the other metallic plate.

In order to rule out to a great extent contact between the connecting pin which is connected to the metallic plate on the side of the printed circuit board facing away from the component, in a particularly advantageous development of the invention, the connecting pin is provided with an insulating sleeve, which can be connected to the component housing. The insulating sleeve additionally advantageously ensures protection against pole transposition of the component, which is of special importance in particular in the case of electrolytic capacitors, since the connecting pin with the sleeve does not fit through the other hole with a lower diameter.

In a development of the mounting configuration according to the invention, a further metallic plate can be disposed on the side of the printed circuit board facing away from the component, for the purpose of further cooling, and is likewise isolated from the other metallic plate by an electrically insulating layer.

The electrically insulating layers can be any desired adhesives, in particular adhesives that conduct heat well. However, use can also be made of double-sided adhesive films, since these are particularly easy to handle.

An important feature of the mounting configuration according to the invention is that it dispenses with an insulating substrate material, such as is regularly used in conventional printed circuit boards, and the stability of the printed circuit board is effected by the relatively thick metallic plates, while the insulating intermediate layers merely fulfill the function of the mechanical connection.

Other features which are considered as characteristic for the invention are set forth in the appended claims.

Although the invention is illustrated and described herein as embodied in a mounting configuration of electric and/or electronic components on a printed circuit board, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
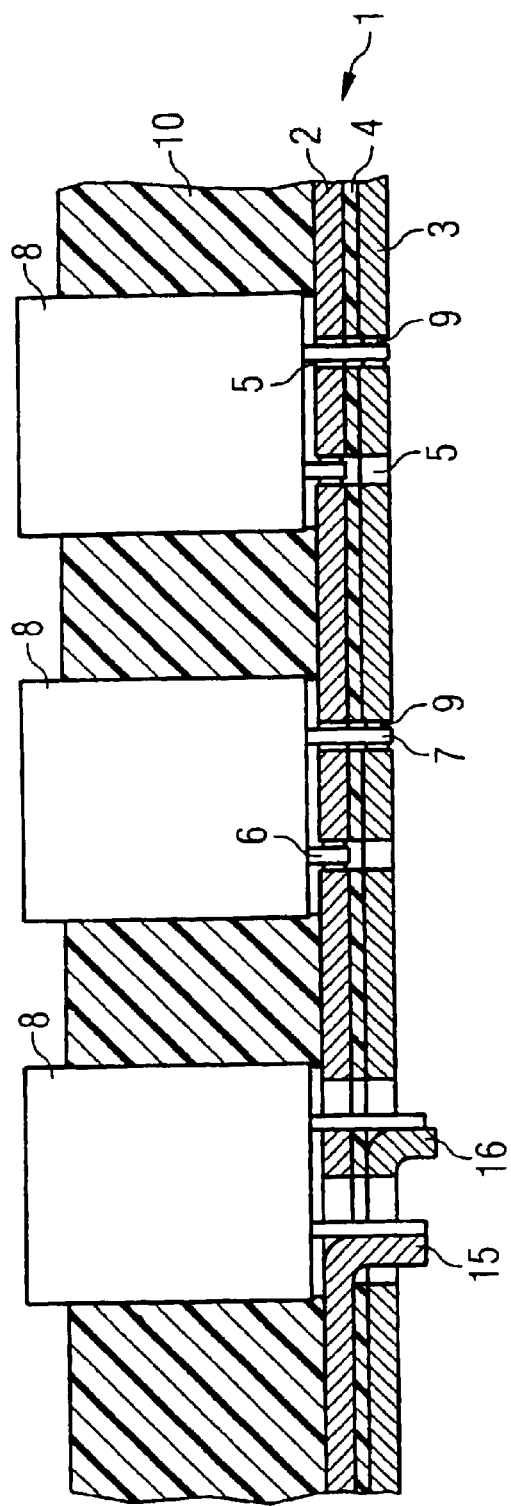
FIG. 1 is a diagrammatic, sectional view of a first embodiment of a mounting configuration according to the invention.

Referring now to the figures of the drawing in detail and first, particularly, to FIG. 1 thereof, there is shown a printed circuit board 1, which is formed by a first metallic plate 2 and a second metallic plate 3. The two metallic plates 2, 3 are connected to each other by an electrically insulating layer 4, which may be, for example, an adhesive or else a double-sided adhesive film.

The printed circuit board 1 has holes 5, which can be produced in a simple manner, for example by punching, and into which connecting pins 6, 7 of an electric and/or electronic component 8 are plugged. Here, the holes can have any desired shape. In the exemplary embodiment illustrated, the connecting pins have different lengths, so that a first connecting pin 6 projects only through the first metallic plate 2, while a second connecting pin 7 projects as far as the second metallic plate 3. This prevents the first connecting pin 6 from making contact with the second metallic plate 3. The connecting pins 6, 7 are connected electrically to the associated metallic plates 2, 3. The connection can be produced, for example, by welding or soldering. In the exemplary embodiment illustrated, the connection is produced via tin solder 9.

It is also possible to mold a connecting pin 15 or 16 integrally on one of the metallic plates in each case at a pair of holes, for example to punch it out during the punching operation and to bend it over, so that the plate connecting pin can be connected electrically to the component connecting pin in a simple way. This is illustrated schematically in the case of the left-hand component in FIG. 1.

The components 8 are potted with an elastic polymer 10, for example polyurethane, in order to mount them with as little vibration as possible, in order that in a use preferably in a motor vehicle, where severe vibration can occur, the connections between components and printed circuit board are not destroyed.

The components 8, which are in particular electrolytic capacitors for use in a motor vehicle, are connected to the supply voltage potential and the ground potential via the two metallic plates 2, 3. As a result of the construction selected, the mounting configuration according to the invention implements particularly loss-free and low-inductance feed of the supply energy. In addition, good thermal dissipation is ensured, and can be adjusted by selecting the suitable thickness of the metallic plates 2, 3.

For an application in an integrated starter-generator for a motor vehicle, with the current switches that are common nowadays, for example 1.5 mm can be selected for the thickness of the metallic plates and about 0.1 to 0.2 mm for the thickness of the insulating layer.

Figure 2:
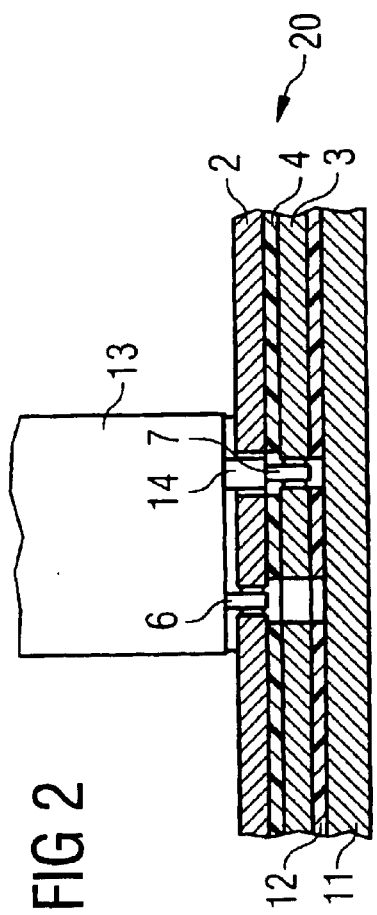
FIG. 2 is a sectional view of a second embodiment of the mounting configuration according to the invention.

A further exemplary embodiment of the invention is illustrated in FIG. 2. There, too, the first metallic plate 2 is connected to the second metallic plate 3 via the insulating layer 4. In a development of the invention, there, a further metal plate 11 is additionally connected by a further insulating layer 12 to the second metallic plate 3. This configuration forms a printed circuit board 20 that permits even better thermal dissipation.

Disposed on the printed circuit board 20 is likewise an electric or electronic component 13, in particular an electrolytic capacitor 13, whose connecting pins are connected in the same manner as illustrated in FIG. 1 to the first metallic plate 2 and the second metallic plate 3.

In a manner according to the invention, the metallic plates 2, 3 have holes of different diameters, specifically in such a way that in the case of two holes located one above another, that one that is not used for the connection to a connecting pin has a larger diameter.

The connecting pin 7 which is connected to the second metallic plate 3, that is to say the metallic plate 3 which is at the center of the printed circuit board 20, is provided with an insulating sleeve 14, whose diameter is dimensioned such that it fits into the hole with the larger diameter but not into the hole with the smaller diameter. By this measure, protection against pole transposition for the component is achieved in a simple way, which is important in particular in the case of electrolytic capacitors, since it is thus possible to dispense with the third connecting pin which is otherwise usual, specifically a second connecting pin for ground, which in addition leads to a reduction in the inductance. It also has the advantage that fewer holes are needed in the printed circuit board 20.

However, the insulating sleeve 14 also serves to insulate the connecting pin with respect to the first metallic plate 2, through which it has to be plugged. Two requirements of the mounting configuration are therefore met by the configuration according to the invention of the electric or electronic component 13.

The mounting configuration according to the invention can be produced in a straightforward manner and has improved mechanical and electrical properties, and is therefore particularly well suited for use in motor vehicles.

We claim:

1. A mounting configuration, comprising:

components each including a first connecting pin being a soldering pin having a given length and a second connecting pin being a soldering pin having a length longer than said given length and said second soldering pin having an insulating sleeve with a predetermined diameter; and a printed circuit board having:

an insulating layer with holes formed therein for allowing said second connecting pin to pass through said insulating layer; and a first metallic plate and a second metallic plate both having holes of a given diameter formed therein and holes of a diameter larger than said given diameter formed therein, said holes of said diameter larger than said given diameter accepting said insulating sleeve of said predetermined diameter, said first and second metallic plates electrically insulated from one another by said insulating layer, said first connecting pin being plugged and connected to said first metallic plate in said holes of said given diameter, said second connecting pin being plugged and connected to said second metallic plate in said holes of said given diameter, each of said holes of said given diameter in one of said first and second plates being aligned with a respective one of said holes of a diameter larger than said given diameter in the other of said plates, and said holes of said diameter larger than said given diameter not being connected to said first and second connecting pins, permitting only said first connecting pin to be connected with said first metallic plate and said second connecting pin to be connected with said second metallic plate.

2. The mounting configuration according to claim 1, wherein said printed circuit board has a further insulating layer and a further metallic plate for cooling disposed next to said further insulating layer, said further insulating layer disposed adjacent said second metallic plate which is remote from a side on which said components are disposed.

3. The mounting configuration according to claim 1, wherein said insulating layer is formed by a double-sided adhesive film.

4. The mounting configuration according to claim 1, wherein said insulating sleeve is disposed on an end of said second connecting pin facing an associated one of said components.

5. The mounting configuration according to claim 1, wherein said components are selected from the group consisting of electrical components and electronic components.

6. The mounting configuration according to claim 1, wherein said components are electrolytic capacitors.

7. The mounting configuration according to claim 1, wherein said insulating layer conducts heat.

* * * * *